United States Patent [19]

Shimohigashi et al.

[11] Patent Number: 4,672,586
[45] Date of Patent: Jun. 9, 1987

[54] SEMICONDUCTOR MEMORY HAVING CIRCUIT EFFECTING REFRESH ON VARIABLE CYCLES

[75] Inventors: Katsuhiro Shimohigashi, Musashimurayama; Masaharu Kubo, Hachioji; Katsuki Miyauchi, Hino; Toshiaki Masuhara; Osamu Minato, both of Nishitama, all of Japan

[73] Assignee: Hitachi, Ltd., Tokyo, Japan

[21] Appl. No.: 617,919

[22] Filed: Jun. 6, 1984

[30] Foreign Application Priority Data

Jun. 6, 1983 [JP] Japan .................................. 58-99341

[51] Int. Cl.$^4$ ............................................. G11C 11/40
[52] U.S. Cl. ..................................... 365/229; 365/230
[58] Field of Search ........................ 365/189, 229, 230

[56] References Cited

U.S. PATENT DOCUMENTS

| 3,859,638 | 1/1975 | Hume, Jr. ............................ 365/229 |
| 4,492,876 | 1/1985 | Colbert et al. ....................... 365/229 |
| 4,539,660 | 9/1985 | Miyauchi et al. .................... 365/229 |

*Primary Examiner*—Terrell W. Fears
*Attorney, Agent, or Firm*—Antonelli, Terry & Wands

[57] ABSTRACT

A semiconductor memory using a dynamic memory device, wherein a battery supplies a power source voltage and a substrate bias voltage when the memory is cut off from an external device, and a refresh control circuit changes in refresh timing of the memory device in accordance with the leakage current of the memory device. The power consumption of the memory can thus be reduced and the data can be kept for an extended period without an external power source.

4 Claims, 15 Drawing Figures

SEMICONDUCTOR MEMORY HAVING CIRCUIT EFFECTING REFRESH ON VARIABLE CYCLES

BACKGROUND OF THE INVENTION

This invention relates to a memory using a dynamic semiconductor memory.

A floppy disk is one of the conventional memory devices for file, but is not sufficiently reliable because it has a bulky mechanical portion. Moreover, it is not highly portable. Great hopes are therefore placed on semiconductor technology to develop electronized file memory devices. Since the semiconductor memories are volatile (or they lose the data stored therein when a power source is cut off), their application to the file requiring non-volatility is difficult.

Among the semiconductor memories, a dynamic memory, in particular, has power consumption which is incomparably greater than that of a static memory, and can not be used for the file application by means of battery back-up. Counter-measures for temporary breakdown of an external power source such as interruption of service are disclosed in Japanese Patent Laid-Open No. 153,580/1981, for example.

This prior art provides a dynamic memory module with a refresh circuit besides that of a CPU module, so that the memory is refreshed by the refresh circuit of the CPU module so long as an AC power source is supplied, and is refreshed by the refresh circuit of the memory module once the AC power source is cut off for some reason or other, thereby permitting the memory module to operate by itself. This construction eliminates the necessity that a back-up battery supplies the power to both CPU and memory modules, and the power consumption can be reduced because the power may be supplied to only the memory module.

However, the power consumption of dynamic memories must be reduced further drastically for those applications where the device is cut off from the external power source such as a file memory device for an extended period of time.

SUMMARY OF THE INVENTION

The present invention is directed to provide a semiconductor memory suitable for a file memory device, by reducing the power consumption of a volatile semiconductor memory, especially a dynamic memory, so as to keep the data for a long period by use of a battery.

In order to accomplish the object described above, the present invention reduces the power consumption during a refresh period of dynamic memories by constituting the refresh control circuit in such a manner as to control the refresh timing in accordance with the potential of a data memory capacitor portion of the memory cell.

In a preferred embodiment of the present invention, a substrate bias voltage of a semiconductor substrate is supplied by a substrate bias voltage generation circuit so long as the power is supplied from an external power source, and is supplied by a battery once the power from the external power source is cut off, so as to eliminate the power consumption of the substrate bias voltage generation circuit during battery back-up period.

DESCRIPTION OF THE PREFERRED EMBODIMENTS

Figure 1:
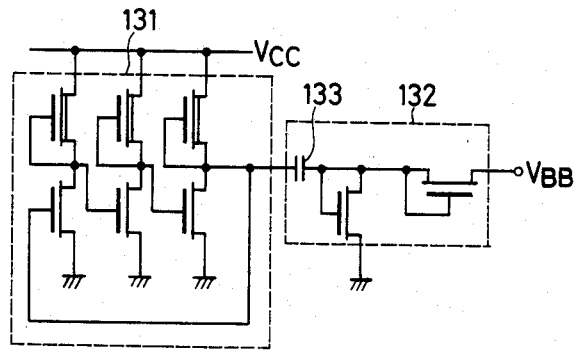
FIG. 1 is a circuit diagram of a conventional substrate bias voltage generation circuit.

The following requirements must be satisfied in order to reduce the power consumption of a memory system as a whole (e.g., below 1 mW) to such an extent that even a small battery can supply the power for a long period (e.g., for more than one month):

(1) a refresh timer whose oscillation frequency becomes higher with an increasing temperature;
(2) the battery supplies a substrate bias voltage of a memory device; and
(3) a dynamic memory device by CMOS technology.

Table below illustrates the power consumption required for the data holding operation by one chip of the conventional dynamic memory.

TABLE

| | | Power consumption | Remarks |
|---|---|---|---|
| When holding the data | AC component | 5 mW | Power source 5 V refresh time 2 ms 64K-bit dynamic memory |
| | DC component | 20 mW | |

Thus, one chip consumes 25 mW power. It is nearly impossible to supply such large power by a battery for a long period.

However, the power consumption can be reduced as follows by utilizing techniques described above.
(1) Among the DC power, 12.5 mW can be reduced substantially to zero by the application of the CMOS technology.
(2) The remaining 7.5 mW of the DC power can be reduced drastically by supplying the substrate bias voltage from the battery.

Conventionally, this 7.5 mW power is supplied by a substrate bias voltage generation circuit. As shown in FIG. 1, this substrate bias voltage generation circuit consists of an oscillator 131 and a charge pump circuit 132, for example. The 7.5 mW power is a mean charge-discharge power of a capacitor 133 inside the charge pump circuit. Accordingly, the power can not be reduced even if the CMOS technology is employed. The efficiency is extremely low in view of the fact that a current of an average of a few micro-amperes needs be supplied to the substrate in practice.

If the substrate bias voltage is supplied by a battery when the power is no longer supplied from an external power source or if it is supplied by a 3 V battery, for example, the power consumption of the battery may be only 3 $\mu$W.

(3) The AC content of the data holding power, i.e., 5 mW, can be reduced by adjusting the frequency of the refresh operations in accordance with temperatures.

This 5 mW power depends upon the cycles of the refresh operation in order to prevent the data loss due to a leakage current from the memory cell.

The refresh cycle greatly depends upon the temperature of the memory chip. FIG. 3 shows the temperature dependence characteristics. As the temperature drops, the leakage current decreases and the interval between the refresh operations becomes longer. Generally, the refresh time of memories is fixed at 2 ms. This time is decided in consideration of the operation at a temperature of a memory chip ranging from 100° to 125° C. on the basis of a maximum ambient temperature of 75° C. and the temperature increment of from 30° to 50° C. due to self-exothermy.

Figure 2:
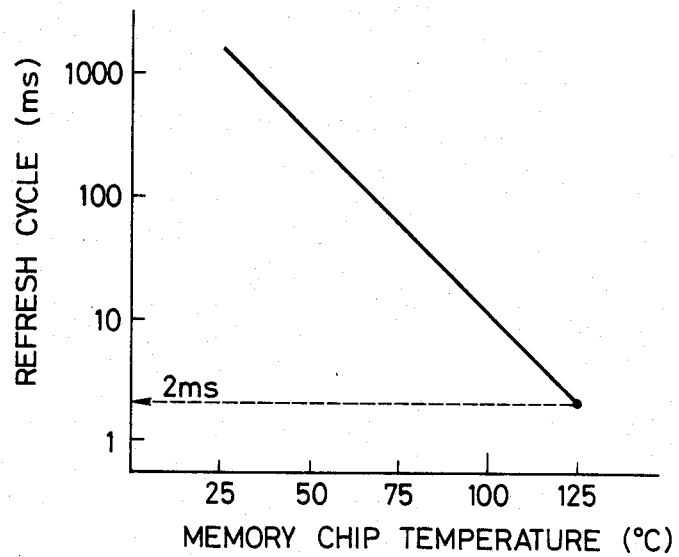
FIG. 2 is a diagram showing the temperature characteristics of the refresh time of a memory cell.

As can be seen from FIG. 2, however, the frequency of the refresh operations can be reduced on an average and the power can be reduced in proportion thereto, if the refresh time is extended when the temperature is low and is shortened proportionally when the temperature becomes higher.

One embodiment of the present invention based upon the concept described above will now be described.

Figure 3A:
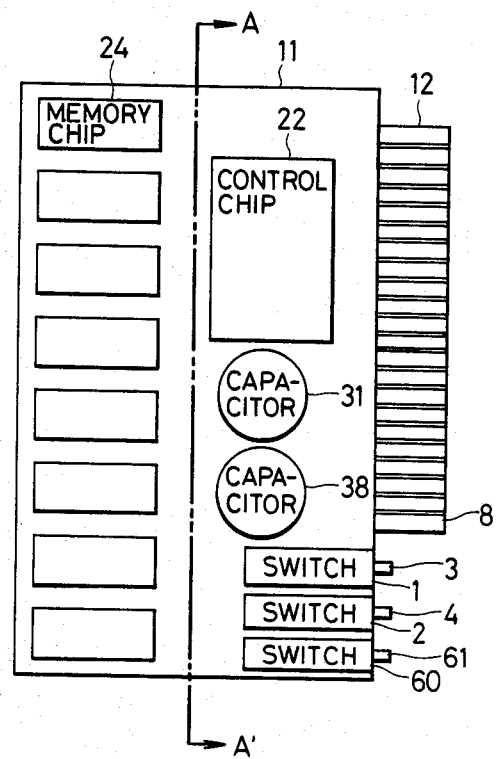
FIG. 3A is a perspective view of the semiconductor memory in accordance with one embodiment of this invention.
Figure 3B:
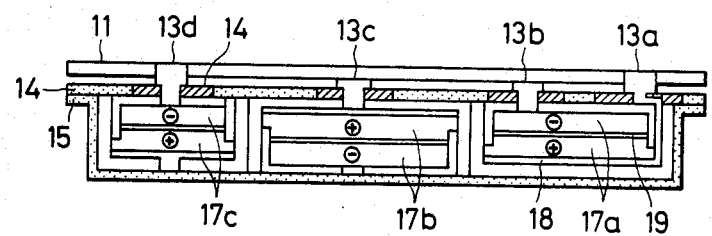
FIG. 3B is a sectional view of the device shown in FIG. 3A.

FIG. 3A is a perspective view of the memory in accordance with one embodiment of this invention, and FIG. 3B is a sectional view taken along line A—A' of FIG. 3A.

A memory chip 24 is a CMOS chip, has 1-transistor type memory cell and generates 1-bit data in accordance with address and control signals.

A chip 22 is a CMOS control chip which controls the address and control signals of the memory chip 24. Switches 1, 2 and 60 detect whether or not connection to an external device is established, and capacitors 31 and 38 are disposed for stabilizing the power source. These circuit elements are disposed on a printed circuit board 11. On the other hand, components 14 through 19 constituting a battery are disposed on the reverse of the printed circuit board 11.

The printed circuit board is further equipped with connectors.

The battery components include three solid primary cells 17a through 17c. When the substrate of the memory chip 24 is of a P type, the solid primary cell 17c supplies a substrate bias voltage to the memory chip 24 through a terminal 13d.

The positive and negative plates of the solid primary cells 17a and 17b are connected in series with one another through terminals 13c and 13b, respectively. The positive plates of the solid primary cells supply the positive power source for operating the device. The positive and negative plates of the solid primary cells 17c and 17b are connected by a metal 15 and supply the ground potential to the device. Reference numeral 14 represents a ceramic seal, 18 is a metal (Ni, stainless steel, or the like), and 19 is a battery separator.

Normally, switch buttons 3, 4 and 61 project from the switches 1, 2 and 60, respectively. When they are pushed toward the external device, they are buried into the external device and actuate contacts.

Connection to the external device is established by the connectors 12. The write data and control signals are applied from the external device to the memory through the connectors 12, and the read data is sent from the memory to the external device.

An operating power source is applied from the external device to the memory through the terminal 8.

Next, the circuit of the device of this embodiment will be described.

Figure 4:
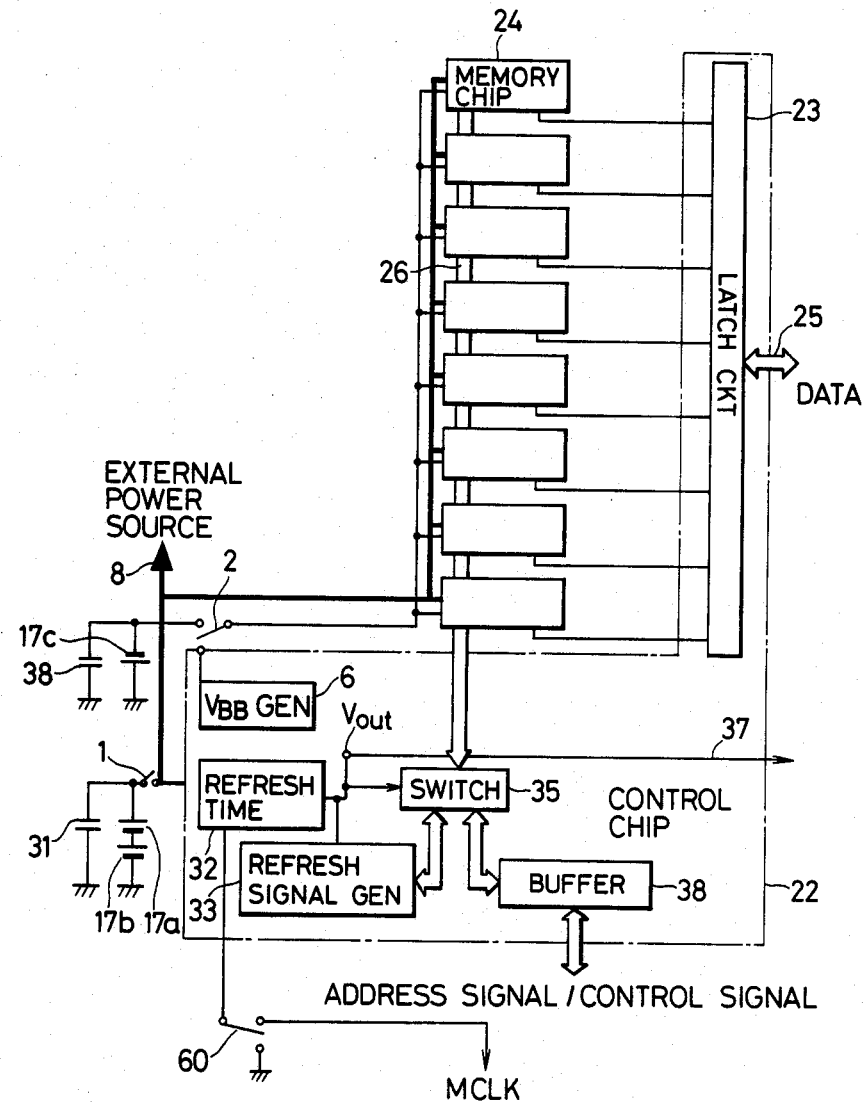
FIG. 4 is a circuit diagram of the memory shown in FIG. 3A.

FIG. 4 illustrates a semiconductor memory having eight 256 K-bit memory chips 24. The capacity of this semiconductor memory is therefore 256 Bytes.

In the drawing, reference numeral 24 represents a memory chip, 25 is a data bus, 26 is address and control lines, 1 and 2 are switches, and 6 is a power source for the substrate bias voltage. During normal operation, the address and control signals applied to the address buffer inside a control chip 22 are given to the eight memory chips, respectively, and each memory chip executes read and write of 1-bit data.

A capacitor 38 is connected in parallel with the solid primary cell 17c while a capacitor 31 is connected with the solid primary cells 17a and 17b, for stabilizing the power.

The refresh timer 32 produces a refresh start pulse $V_{out}$. A refresh signal generation circuit 33 is started by the refresh timer 32, and produces refresh address signals and refresh control signals. The refresh timer 32 is started by MCLK signals applied from the external device through the switch 60, and its detail will be given elsewhere.

The refresh timer 32 and the refresh signal generation circuit 33 execute the refresh operation of the memory system at every predetermined time and let it store and keep the data, whether or not they may be connected to the external device.

Reference numeral 17c represent a battery for supplying the substrate voltage of the semiconductor memory, and its detail will be given elsewhere.

The refresh timer 32 produces the refresh start pulses $V_{out}$ at every predetermined time. The refresh signal generation circuit 33 memorizes which memory address should be refreshed. Upon receiving the refresh start pulse $V_{out}$, the switch 35 cuts off the address signals and control signals from the external device, but transmits the refresh address signals and refresh control signals from the refresh signal generation circuit 33 to the eight memory chips. The switch 35 transmits the address signals and control signals from the external device to the eight memory chips other than when refresh is executed. The refresh start pulse $V_{out}$ transmits the signal representing that refresh is executed, to the external device. When the pulse $V_{out}$ is sent to the external device, memory access from the external device is temporarily inhibited as refresh is being executed.

In the device of the present invention, the cells 17a through 17c and the power supplied from the external device are changed over in the following manner.

Device operating power source

When the device of the invention is connected to the external device (not shown), the positive power is supplied to the control circuit 22, the memory chip 24 and the control chip 22 through the power terminal 8 inside the connector 12. When the device of the invention is removed from the external device, the switch button 3 of the switch 1 returns to its original position, and the operating power is applied from the cells 17a, 17b to the memory chip 24 and the control chip 22.

When holding of the memorized data is not necessary, this switch 1 can be turned off in order to prevent the consumption of the cells. For example, the switch is turned off during the period from shipment from a factory till the start of actual use by a customer. Furthermore, the switch can be used for clearing simultaneously all the memory contents of the memory chip 24.

Memory substrate bias voltage

When the printed circuit board 11 is connected to the external device, the power is supplied to the power terminal 8 and the substrate bias voltage generation circuit 6. The substrate bias voltage generation circuit 6 is the same as the circuit shown in FIG. 1. This circuit generates a negative voltage and applies the substrate bias voltage to the memory chip 24.

When the printed circuit board 11 is removed from the external device, the switch button 4 of the switch 2 returns to its original position, and the switch 2 changes the connection from the substrate bias voltage generation circuit 6 to the power source 17c, so that the power source 17c supplies the substrate bias voltage to the memory chip 24.

Figure 5A:
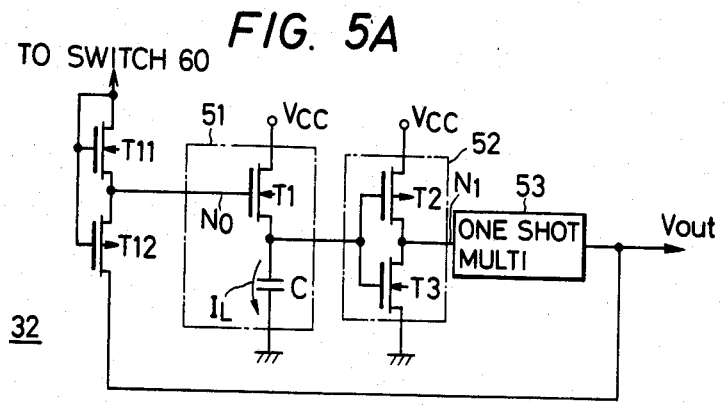
FIG. 5A is a fundamental circuit diagram of the refresh timer used in the device of FIG. 4.
Figure 5B:
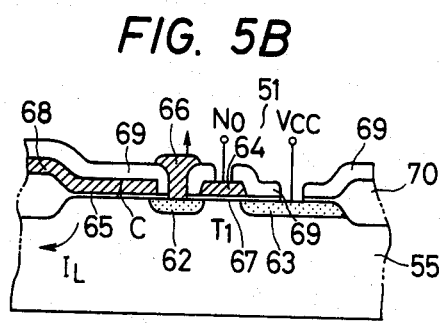
FIG. 5B is a sectional view of the memory cell potential generation portion of the refresh timer shown in FIG. 5A.

FIG. 5A shows the fundamental circuit of the refresh timer 32 of this embodiment. In this drawing, reference numeral 52 represents a CMOS inverter, which monitors the voltage change at a node NO due to a leakage current $I_L$, and generates an output $V_{out}$ when it reaches a certain threshold value. Reference numeral 51 represents a one-transistor type memory cell itself or a pseudo memory cell having a structure analogous to the former. FIG. 5B illustrates the structure of the pseudo memory cell. A transistor $T_1$ is formed on a substrate 55 by a gate 64, diffused layers 62,63 and a gate oxide film 67. A capacitor C is formed by a gate oxide film 65, an electrode 68 and an inversion layer formed below the gate oxide film. The capacitor C and the transistor $T_1$ are directly connected to each other through the diffused layer 62. Reference numerals 69 and 70 repesent silicon oxide films. The structure described above is the same as the structure of one-transistor memory cell used for the memory chip 24.

The pseudo memory cell 51 is further equipped on the diffused layer 62 with a contact 66 so as to use the potential of the diffused layer 62 as the input of the inverter 52. A power source voltage is applied to the diffused layer 63.

In the same way as the memory cells of the memory chip 24, the pseudo memory cell 51 utilizes the charge, which is stored in the inversion layer below the gate oxide film 65 and flows out as a leakage current $I_L$ to the substrate 55, in order to detect the loss of the stored data of the memory cells of the memory chip 24.

Reference numeral 52 represents a CMOS invertor, which monitors a potential change of the diffused layer 62 due to the leakage current $I_L$, and raises the potential of a node $N_1$ to a high level when the change reaches a certain threshold value. Reference numeral 53 represents a one-shot pulse generation circuit.

Figure 5C:
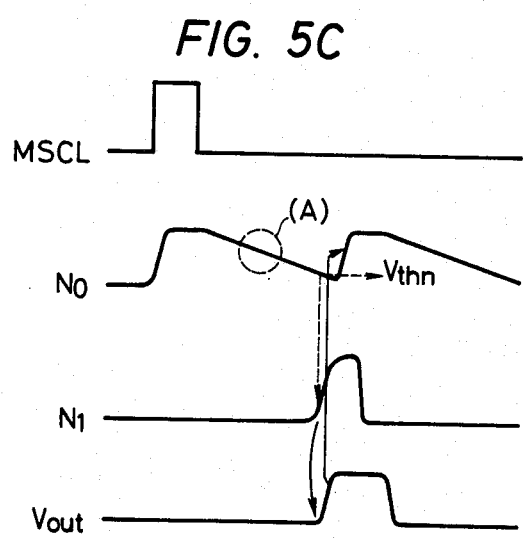
FIG. 5C is an operation waveform diagram of the refresh timer shown in FIG. 5A.

FIG. 5C illustrates the operation waveforms of the refresh timer 32 shown in FIG. 5A. After MSCL is once applied from the external device, the refresh start pulse $V_{out}$ is thereafter generated automatically. The transistors $T_{11}$, $T_1$ are turned on by MSCL, and the capacitor C is charged by the power source $V_{cc}$. When the transistor $T_1$ is thereafter turned off, the capacitor C gradually discharges due to the leakage current $I_L$, and the potential at the node NO decreases. When the voltage at the node NO becomes below the threshold value of the CMOS inverter 52, the potential at the node N1 becomes high. The refresh start pulse $V_{out}$ becomes high through the one-shot pulse generation circuit 53, and after the passage of a predetermined period, it becomes low. On the other hand, the transistor $T_1$ is turned on by $V_{out}$, and the capacitor C is charged.

Incidentally, the threshold value of the CMOS inverter is set to a value higher than the voltage at which re-write of the memory chip 24 is not possible, in order to prevent the data loss of the memory chip 24.

The memory system of this embodiment can thus keep the memory content even if the external power source does not exist, and can possess non-volatility.

Although the refresh timer can cover the full temperature range of the memory in principle, the ambient temperature when the memory keeps actually the data is from 10° to 40° C. and a temperature due to self-exothermy does not exist because the power consumption is drastically reduced. Accordingly, the refresh time can be extended incomparably than the prior art and hence the AC power can be reduced drastically in proportion to the former (from 5 mW to 10–20 $\mu$W).

Accordingly, the memory of this embodiment can reduce the data holding power from 25 mW/device of the prior art to 10 to 20 $\mu$W/device, and the value is from 80 to 160 $\mu$W for the system shown in FIG. 4. It becomes therefore possible to keep the data of a highly integrated dynamic memory by using a battery and to provide the memory with non-volatility even if no external power source exists.

Next, another embodiment of the present invention will be described.

First, a modified example of the refresh timer will be explained with reference to FIG. 6.

This circuit reduces the current by preventing a penetration current of the invertor 52 occurring when the output voltage of a leakage current source 51 is at an intermediate voltage (potential A in FIG. 5c).

Figure 6:
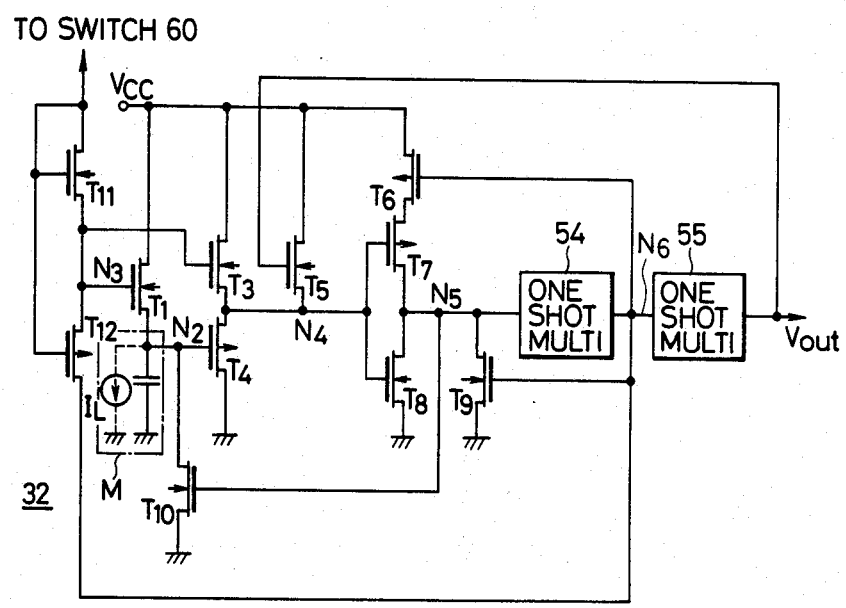
FIG. 6 is a circuit diagram showing another example of the refresh timer shown in FIG. 4.

In the circuit shown in FIG. 6, the timing is deviated by one-shot pulse generation circuits 54 and 55 lest the transistors T4 and T5 are simultaneously turned on.

Figure 7:
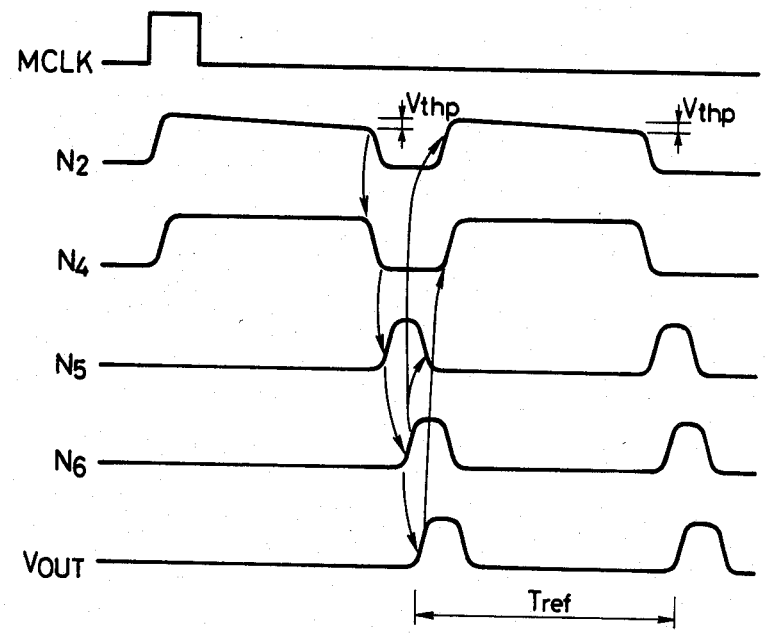
FIG. 7 is an operation waveform diagram of the refresh timer shown in FIG. 6.

The circuit operation will be explained with reference to the waveform at each point shown in FIG. 7.

After MCLK is once applied from the external device, this circuit automatically produces the refresh start pulses $V_{out}$. A switch 60 is disposed in order to connect the file memory to MCLK when the file memory is used practically (CPU or the like) and to the ground when the data are to be held. Grounding is effected in order to prevent mixture of noise when the memory is removed from the external device.

(1) When MCLK is applied, the node N3 is raised to the high level and turns on the transistor T1, so that the capacitor M is charged.

(2) As the charge stored in the capacitor M is reduced by the leakage current $I_L$, the voltage drops gradually.

When the voltage exceeds the threshold voltage of the transistor $V_{thp}$, the transistor T4 is turned on, whereby the node N4 drops to the low level.

(3) When the node N4 drops to the low level, the output (at the node N5) of the inverter (transistors T7, T8) rises to the high level.

(4) When the node 5 reaches the high level, the transistor T10 is turned on and the charge of the capacitor M is all discharged, and the output (at the node N6) of the one-shot pulse generation circuit 54 becomes the high level.

(5) When the node N6 reaches the high level, the node N3 rises to the high level because the transistor T12 is turned on, so that the capacitor M is charged and the transistor T4 is turned off. As the transistor T6 is turned off, the node N5 drops to the low level, turning off the transistor T10. Furthermore, the output $V_{out}$ of the one-shot pulse generation circuit 55 rises to the high level.

(6) Finally, the transistor T5 is turned on by output $V_{out}$, raising the node N3 to the high level.

The operations described above are repeated to determine the refresh intervals $T_{ref}$.

In the manner described above, the circuit of this embodiment becomes a completely dynamic circuit which operates due only to the charge and discharge of the capacitor.

Figure 8:
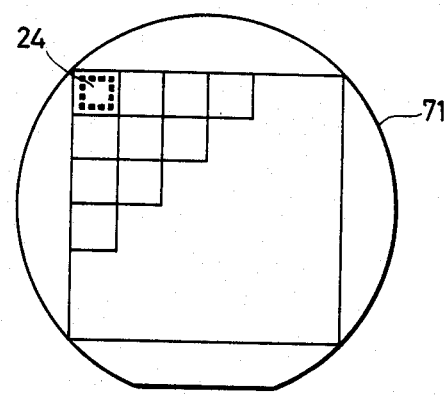
FIG. 8 is a schematic view of another embodiment of the present invention.
Figure 9:
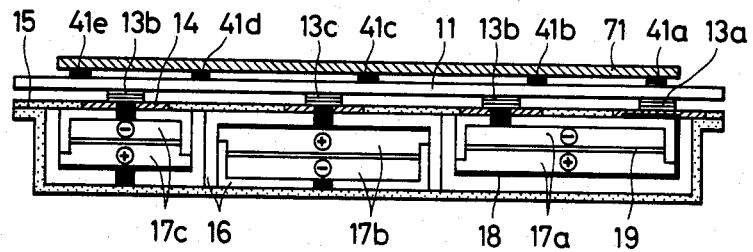
FIG. 9 is a sectional view of the device of FIG. 8 when packaged practically.

Next, another embodiment in which the memory chips 24 are mounted to one wafer will be described with reference to FIGS. 8 and 9.

The memory chips 24 are assembled on the wafer 71. FIG. 9 is a sectional view when the wafer 71 is actually packaged.

Power is supplied from the battery to the printed circuit board 11 through the connection portions 13a through 13d, and power supply between the printed circuit board 11 and the wafer 71 is made through the connection portions 41a through 41d. Incidentally, like reference numerals are used to identify like constituents as in FIG. 3B. The control chip 22, switches 1, 2, 60, capacitors 31, 38 and connector 12 of FIG. 3A are not shown in the drawing, though they are disposed on the printed circuit board 11.

Figure 10:
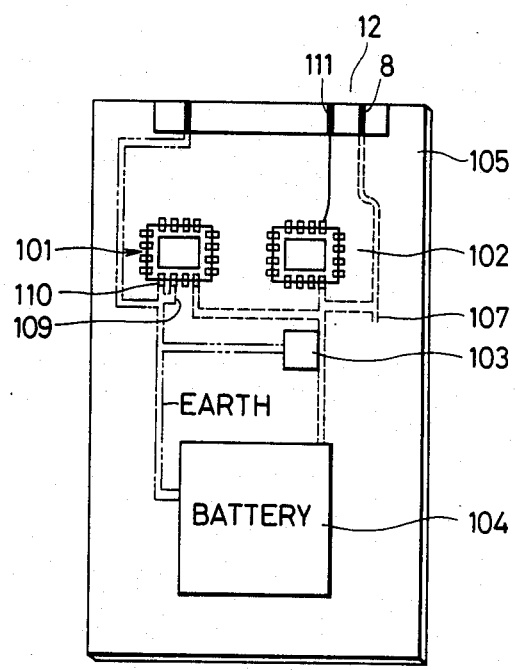
FIG. 10 is a schematic view of still another embodiment of the present invention.

FIG. 10 shows an example in which the memory substrate bias voltage is used as the ground voltage. In this example, the substrate bias voltage is used as the ground voltage, whether or not the system is connected to the external device.

Conventionally, the substrate bias voltage is applied for the following three reasons.

(1) to adjust the transistor threshold values on the semiconductor substrate;

(2) to reduce the circuit capacitance of the semiconductor substrate and to attain high speed operation; and (3) a large current flows and a device will be broken down unless reverse bias is applied when the n-type device portions becomes negative due to the input voltage undershoot if the substrate is of the p-type.

However, in conjunction with the item (1), the threshold value of transistors can be adjusted easily at present by ion implantation or the like, and hence the technical significance of the application of the substrate bias voltage is now not much great.

In conjunction with the item (2), there is no significance to apply the substrate bias voltage during holding of the data because the high speed operation is not necessary when the semiconductor file memory is cut off from the external device and holds the data.

The problem in the item (3) can be solved by employing a p-n-p (or n-p-n) structure for the circuit so as to avoid the application of forward bias.

It can be understood from the explanation described above that the substrate bias voltage may be connected to the ground when the file memory only holds the data.

The device shown in FIG. 10 is constituted by actually packaging a memory chip 101, a control chip 102, a capacitor 103 and a chargeable thin film battery 104 into a thin plastic card 105 (having a size approximate to a name card). Reference numeral 12 represents a connector, and 8 is a terminal for an external power source. Dotted line represents a power source line, and one dot-and-chain line represents a grounding line. In this embodiment, the grounding line is connected to the ground terminal 110 of the memory chip 101 and to the substrate bias voltage terminal 109.

This embodiment does not have the switch 1 shown in FIG. 3A but is directly connected to the battery 104. Accordingly, the power from the external source is also supplied to the thin film battery so that the battery 104 is automatically charged.

Since no power source for the substrate bias is necessary in this embodiment, the components corresponding to the switch 2, capacitor 38 and battery 17c in FIG. 3A do not exist. Incidentally, the switch 60 is not necessary in this embodiment because MCLK is directly applied to the refresh timer inside the control chip through the terminal 111.

Since this embodiment is of a card type, it is effective as a personal file for private use which is portable and has a relatively small capacity (0.5 to 2 MB).

Figure 11:
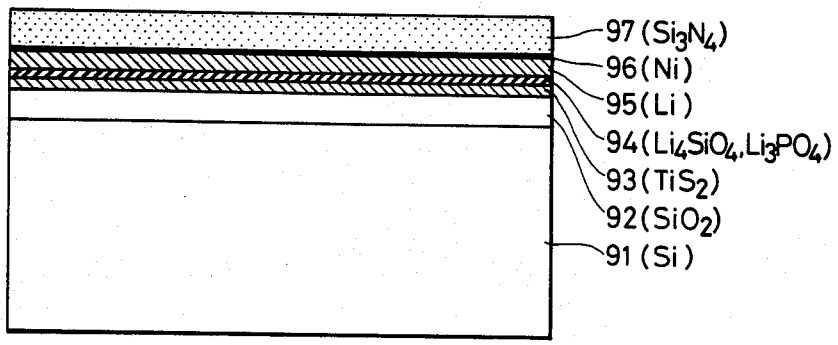
FIG. 11 is a sectional view of the battery used in the device shown in FIG. 10.

FIG. 11 illustrates an example of the structure of the thin film secondary cell used for the device shown in FIG. 10. The thin film battery is shown formed on an Si substrate 91 and a field oxide film 92. Reference numeral 93 represents a positive plate, which is made of TiS2, and 94 is a solid electrolyte, which is made of a solid solution of $Li_4SiO_4$ and $Li_3PO_4$. Reference numeral 95 represents a negative plate, which is made of Li or LiAl alloy, and 96 is a current collector. A suitable material for the current collector is Ni. Reference numeral 97 represents a protective film, which is made of $Si_3N_4$, or the like.

Figure 12:
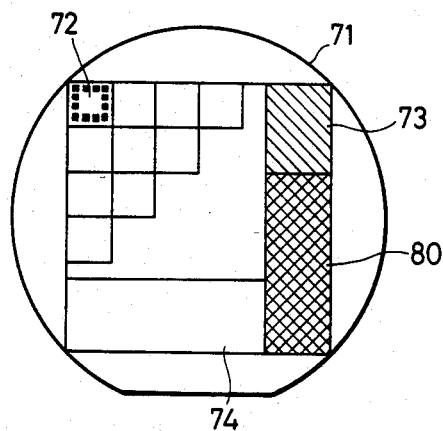
FIG. 12 is a schematic view of still another embodiment of the present invention.

FIG. 12 illustrates an example in which the substrate bias voltage is used as the grounding voltage and all the memory chip, control chip and battery are assembled on one wafer. In this example, the control chip 74, the thin film battery 73 and a power source capacitor 80 are also integrated on the wafer 71 having the memory device 72 so as to enable the memory device 72 to keep the data. Unlike the embodiment shown in FIG. 9, the consumed battery in this example can not be replaced independently, so that the battery is preferably a chargeable secondary cell. It is apparent that the capacitor can be easily produced by ordinary LSI process. The capacity of the power source capacitor is believed to be about 10 μF. If the capacitor is realized by MOS capacitor using 500 Å-thick $SiO_2$, for example, the size can be made below 1 cm², and the capacitor area is below 1% of the total area of the wafer when a 5 in-wafer is used.

As described above, the present invention provides the effect that the power required for refreshing the memory can be reduced drastically.

What is claimed is:

1. A memory comprising:

a memory device;

a voltage generating circuit for converting a power source voltage supplied from an external device for reading and writing said memory device and supply operation power to said memory device, and generating a substrate bias voltage;

a first battery for supplying said substrate bias voltage when the operation power is not supplied from said external device; and a second battery for supplying said memory device when the operation power is not supplied from said external device.

2. A memory according to claim 3, wherein said memory further comprises a first capacitor connected in parallel with said first battery, and a second capacitor connected in parallel with said second battery.

3. A memory according to claim 2, wherein said memory device comprises a plurality of memory chips.

4. A memory according to claim 1, wherein said substrate bias voltage of said memory device is the grounding voltage of said battery.

* * * * *